United States Patent

[11] 3,551,759

[72] Inventor Manfred Tschermak
Erlangen, Germany
[21] Appl. No. 814,512
[22] Filed Mar. 28, 1969
Continuation-in-part of application Ser. No. 737,653, June 17, 1968, now abandoned.
[45] Patented Dec. 29, 1970
[73] Assignee Siemens Aktiengesellschaft
Munich, Germany
a corporation of Germany
[32] Priority Aug. 2, 1968
[33] Germany
[31] No. 1,764,773

[54] SEMICONDUCTOR
8 Claims, 10 Drawing Figs.

[52] U.S. Cl. 317/234, 317/235; 174/52.5, 174/68.5
[51] Int. Cl. H01l 1/14
[50] Field of Search 317/234, 235, 3, 4, 5, 54; 174/52.5, 68.5

[56] References Cited
UNITED STATES PATENTS
3,013,913 12/1961 Croop et al. 174/68.5
3,312,771 4/1967 Hessinger et al. 174/52.5

*Primary Examiner*—James D. Kallam
*Assistant Examiner*—R. F. Polissack
*Attorneys*—Curt M. Avery, Arthur E. Wilfond, Herbert L. Lerner and Daniel J. Tick

ABSTRACT: The invention relates to a compact lead-in of at least one electrical and/or heat conductor through an insulator. According to the invention, the conductor is a porous sintered metal body, which is enclosed and at least partly penetrated by a synthetic material which simultaneously forms the insulator. The conductor may comprise at least one housing portion of metal which is contacted with one of the connecting faces of the semiconductor body. The housing portion and jacket portion together with the conductor structure completely encapsulate the semiconductor body. The housing portion and/or the conductor portion, at least at the locality adjacent to the plastic material of the jacket, consists of sintered material.

SEMICONDUCTOR

This is a continuation-in-part of application Ser. No. 737,653, filed June 17, 1968, now abandoned.

During the production of the metallic lead-ins as electrical conductors and/or for removing the heat from electrical components, particularly semiconductor components, for example diodes, transistors or thyristors, etc., which are either embedded or encapsuled in insulating bodies, one often encounters difficulties caused by the lack of compactness or density of the lead-ins. The present invention has among its objects overcoming these difficulties.

In bonding a jacket of plastic material with the metallic housing portion by giving to the plastic jacket flangelike projections, which projections grip the metallic portion of the housing, a reliable mechanical bond between the plastic jacket and the metallic portion of the housing is obtained. Such connection is insufficiently tight under all occurring operating conditions, particularly very frequent and intensive changes in temperature.

It is another object of my invention to provide in devices of the above-mentioned type, a junction between the plastic jacket and the metallic portion of the housing that secures a strong and tightly sealed connection even under extreme operating conditions. To this end, and in accordance with my invention, the housing portion and/or the terminal structure in a semiconductor component of the above-mentioned general type consists of sintered metal at least at the particular locality or area contacted by the plastic material.

The invention relates to a compact lead-in of at least one electrical and/or heat conductor through an insulator. According to the invention, the conductor is a porous sintered metal body which is enclosed and at least partly penetrated by a synthetic material, which simultaneously forms the insulator. According to another, more specific feature of the invention, the housing portion or the terminal portion of metal is completely made of sintered metal.

The pores of the sintered metal body must be filled to a point whereby a compound body is created, which is sufficiently dense for its purpose. Furthermore, the porosity must be such as to ensure an adequate electrical and heat conductance, since, as is known, electric conductivity and heat conductivity decrease with an increase in porosity.

The metallic sintered body penetrated by the synthetic material serves both for current conductance and for heat transfer while affording a dense seal for the lead-in. An areal design of the sintered body is particularly preferred for effecting a good heat transfer.

For the purpose of improving the heat removal, the sintered bodies may be provided on their outside with a suitable construction, e.g. ribs. Suitable for either the lead and/or the housing are those metals and alloys which are known to be suitable for the contacting of semiconductor materials. Among these suitable metals are particularly iron, nickel, copper, silver, aluminum, molybdenum and tungsten. For the purpose of the invention, a porosity of the sintered metal of 10 percent to 50 percent has been found particularly well suitable. This metallic portion, relative to the entire volume of the metallic housing portion, may also be composed of a mixture of two or more metals. For reasons of cost, it is advisable to employ copper on account of its good heat conductance to which is added some less expensive iron powder. Preferably employed are 30 percent to 70 percent copper and 70 percent to 30 percent iron, all percentages given in this specification being by weight.

The plastic portion of the housing consists of a thermoplastic or duroplastic casting mass, or a mass or resin as suitable for extrusion molding or for being injection or pressure molded about the structure to be encapsulated. Preferably the plastic employed is on an epoxy resin base.

To employ the dense lead-in, according to the present invention, to produce electrical connections and/or to remove heat from electrical components which are embedded or encapsuled in insulators, and more particularly for semiconductor components, the electrical connection between the sintered bodies, which can also be wire-shaped, and the electrical component, may be effected through soldering, welding or even through pressure contacts. In the last-mentioned instance, the sintered body may be so designed that the side which contacts the semiconductor component may be filled with synthetic material, and thus remains elastic, while the pressure element which is needed to effect the required contact pressure may also be connected thereto.

The details of the present invention will now be disclosed with embodiment examples shown in the drawings, wherein.

Figure 1:
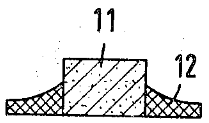
FIGS. 1, 2 and 3 show the construction of the lead-in in accordance with the invention, for one or two lead-ins.

FIG. 1 is a schematic illustration of the construction of the lead-in, in accordance with the present invention. The porous sintered metal body is shown at 11 and the insulating body made of synthetic material, preferably an epoxy based resin, is shown at 12. A synthetic material either in plastic or in liquid form is used to make the sintered metal body 11 dense and to produce simultaneously the insulator 12 which is tightly connected with the sintered body. The synthetic material is cast together, or pressed around, the sintered body in an open or in a closed form, and at appropriate temperature, if necessary by applying an above atmospheric pressure. The pores of the sintered metal body 11 are thereby at least partially filled with the synthetic material. This results in an insulator which encloses the sintered metal body. After the synthetic is reinforced, one obtains a firm and dense connection between the insulator 12 comprised of synthetic material and the lead-in which is enclosed by the synthetic material and comprised of the synthetic-filled sintered metal body 11.

Figure 2:
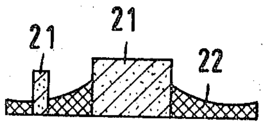

FIG. 2 is a schematic illustration of how the lead-in of the present invention may be produced for individual components with two or more terminals. At 21 are two sintered metal bodies, separated from each other, which are embedded in the insulator 22, comprised of synthetic material and which are, at least partly, penetrated by the material.

Figure 3:
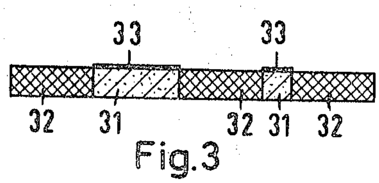

FIG. 3 shows a schematic embodiment of the lead-in of the present invention. This is particularly suitable for lead-ins of semiconductor components which are produced by solder contacting instead of the pressure-contact method. In this type of manufacture, the porous sintered metal bodies 31 are pressed into a synthetic material 32. The synthetic material 32 penetrates laterally into the pores of the sintered metal bodies 31 and there forms a firm and dense connection. For the purpose of applying the semiconductor body by means of soldering, the sintered metal body is provided with thin tin or lead layers 33. These layers may also be used to seal the pores of the sintered bodies which may still be open. This embodiment of the lead-in of the present invention has the advantage that in the press-around method with synthetic material, no special care need be used to ensure that the pores of the sintered metal bodies will be completely filled. During the subsequent tin plating or lead plating complete filling is achieved, with certainty.

Figure 4:
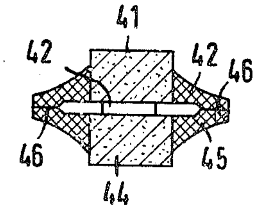
FIGS. 4, 5 and 6 show the uses of the lead-in in accordance with the present invention.

FIG. 4 is a schematic illustration of how a semiconductor component may be encapsulated between two lead-ins in accordance with FIG. 1. At 41 and 44 are two sintered metal bodies, while 42 and 45 are insulators and 43 is the semiconductor component. The insulators 42 and 45 are tightly sealed at the localities 46 by cementing or welding at the edges.

Figure 5:
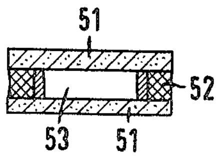
Figure 6:
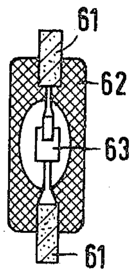

FIGS. 5 and 6 show a particularly simple embodiment for effecting an embedding of a semiconductor component by using the lead-in of the present invention.

FIG. 5 shows two sintered metal bodies indicated as 51, the insulator comprised of synthetic material is 52 and the semiconductor component is 53. In FIG. 6, reference numeral 61 indicates the conductors comprised of porous sintered wires, 62 is the insulator and 63 the semiconductor component. It is possible to combine several semiconductor components in this encapsulation. If several of these components are one-sided on a mutual potential, a favorable thermal coupling is possible on a common sintered disc, through the design of the components.

In FIGS. 7 to 10 the housing portion consisting of sintered metal is denoted by 101. This housing portion provided with a serrated or knurled periphery 111 possesses a central opening 112 of rectangular cross section. Fastened in the opening 112 is the semiconductor device 102. This device comprises a semiconductor body 121 consisting, for example, of monocrystalline silicon and possessing a p-n junction. This semiconductor body is joined by soft-solder or layers 107 with terminal structures 122 and 123 consisting, for example, of copper. The sides of the semiconductor device are protected by a coating of varnish 108 extending between the terminal structures. The semiconductor device 102 is fastened at a planar boundary surface 121 of the opening 112. The fastening is effected by one of the terminal structures 122 and a layer of solder 107. The other terminal structure 123 is connected with a conductor strip 103 by another layer of solder 107. A spring 105 stabilizes the layers of solder and is braced on one side against the wall of the opening 112 and on the opposite side against a pressure body 104 of ceramic material, the pressure body 104 resting upon the conductor strip 103. The space between the semiconductor device and the housing portion 101 is filled with a plastic material 106 which thus, conjointly with the housing portion 101, completely encapsulates the semiconductor device proper. The plastic material, e.g. epoxy resin, may be cast into the assembly or may be introduced by injection molding or pressing. The plastic material then penetrates at least partially into the pores of the housing or terminal portion that consists of sintered and therefore porous metal.

In the just-described embodiment, the solder contacts are stabilized by an additional spring. Such a spring, however, is not always necessary because the plastic material inserted into the encapsulated device often secures a sufficient pressure loading of the soldered localities. The bonding between the semiconductor device proper, on the one hand, and the housing and terminal portion, on the other hand, can be produced by immersion into a bath of solder. This is possible on account of the particular design of the housing portion.

Figure 7:
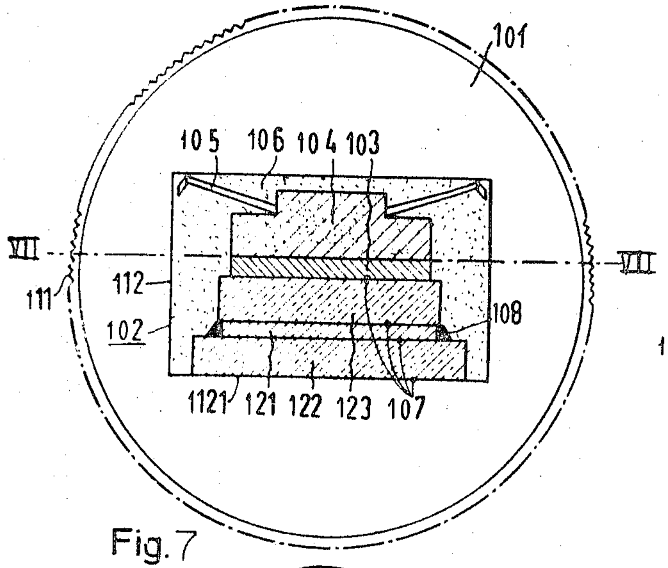
FIG. 7 is a sectional top view of an embodiment with housing.
Figure 9:
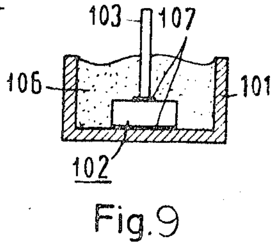
FIG. 9 shows another embodiment with a cup-shaped housing portion.
Figure 8:
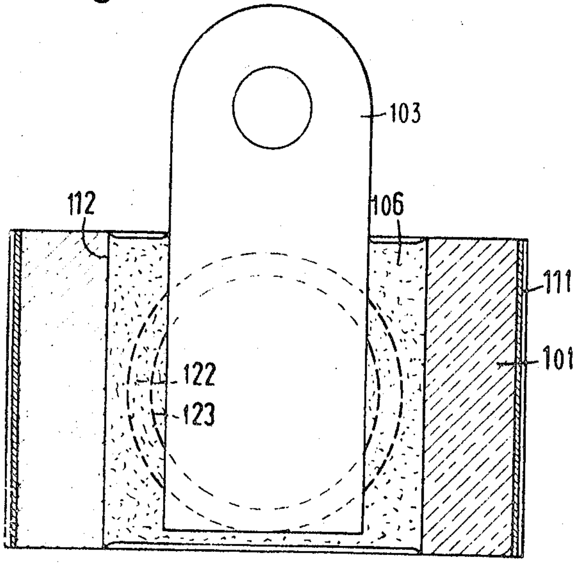
FIG. 8 is a cross section through the device of FIG. 7 along the line VII–VII.
Figure 10:
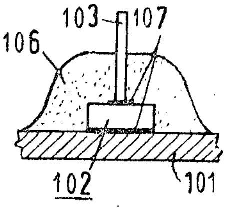
FIG. 10 shows in section a further embodiment with a planar housing portion.

The design of the further embodiments of the invention according to FIGS. 9 and 10 is shown only schematically, the same reference characters being employed as in FIG. 7 for corresponding items respectively. It therefore suffices to presently describe the differences of the additional embodiments from that of FIGS. 7 and 8.

In the embodiment according to FIG. 9, the semiconductor body 102 is located in a cup-shaped housing portion 101 represented in cross section. The bonding of the semiconductor device proper with the housing portion and with the terminal portion 103 is effected through solder layers 107.

In the embodiment according to FIG. 10, the housing portion 101 is formed by a planar plate which may also carry additional semiconductor components or other structural parts and thus may constitute a bus bar.

To those skilled in the art it will be obvious upon a study of this disclosure that my invention permits of various modifications and hence may be given embodiments other than particularly illustrated herein, without departing from the essential features of the invention and within the scope of the claims annexed hereto.

I claim:

1. Dense leads for at least one conductor through an insulating body whereby a porous sintered metal body having at least two ends is provided as a conductor and said ends of the sintered metal body are surrounded by a synthetic material which, at least partly, penetrates said sintered metal body and serves as the insulator.

2. The dense leads of claim 1, wherein the outer faces of the sintered metal body are provided with ribs.

3. The dense leads of claim 1, wherein the sintered metal body are wire-shaped.

4. The dense leads of claim 1, wherein the sintered metal body is comprised of silver, copper or aluminum.

5. The use of the dense leads of claim 4 for the purpose of producing electrical connections and/or to remove heat from electric components, more particularly semiconductor components which are embedded or encapsulated in insulators.

6. A semiconductor component comprising a semiconductor body of monocrystalline material having at least one p-n junction and comprising at least one housing portion of metal which is contacted with one of the connecting faces of the semiconductor body, a jacket portion of the housing consisting of plastic material, which is adjacent to a conductor structure leading to another contacting face of the semiconductor body, said housing portion and jacket portion together with the conductor structure completely encapsulating the semiconductor body, and at least one of said housing portion and conductor portion consisting of sintered material at least at the locality adjacent to the plastic material of the jacket.

7. The semiconductor component according to claim 6, wherein the housing portion has a central passage with at least one planar boundary face, said boundary face being adjacent to the semiconductor body.

8. The semiconductor component according to claim 7, wherein the housing portion has an external cylindrical jacket surface provided with a serration.